(12) United States Patent
Keum

(10) Patent No.: US 7,547,606 B2
(45) Date of Patent: Jun. 16, 2009

(54) SEMICONDUCTOR DEVICE AND METHOD OF MANUFACTURING THE SAME

(75) Inventor: Dong-Yeal Keum, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 432 days.

(21) Appl. No.: 11/313,719

(22) Filed: Dec. 22, 2005

(65) Prior Publication Data
US 2006/0160313 A1    Jul. 20, 2006

(30) Foreign Application Priority Data
Dec. 23, 2004    (KR) .................... 10-2004-0111030

(51) Int. Cl.
*H01L 21/336* (2006.01)
(52) U.S. Cl. ............... 438/307; 438/596; 257/E21.618
(58) Field of Classification Search .......... 438/291, 438/307, 529, 596, 657; 257/E21.618
See application file for complete search history.

(56) References Cited

U.S. PATENT DOCUMENTS 4,597,824 A * 7/1986 Shinada et al. ............ 438/305
4,968,639 A * 11/1990 Bergonzoni ................ 438/231
6,081,010 A * 6/2000 Sanchez .................... 257/345

\* cited by examiner

*Primary Examiner*—Chandra Chaudhari
(74) *Attorney, Agent, or Firm*—Finnegan, Henderson, Farabow, Garrett & Dunner, L.L.P.

(57) ABSTRACT

An exemplary method of manufacturing a semiconductor device according to an embodiment of the present invention includes forming a gate insulation layer on a semiconductor substrate; forming a plurality of gate electrodes on the gate insulation layer; forming pocket regions by a pocket ion implantation process using the gate electrode as an implantation mask; forming a capping electrode layer on the gate electrode by depositing a polysilicon layer; forming lightly doped regions by low-concentration ion implantation using the capping electrode layer as an implantation mask; forming spacer layers on the sidewall of the capping electrode layer; and forming source and drain regions by high concentration ion implantation using the spacer layers as an implantation mask. The method can suppress the occurrence of the punch-through phenomenon.

4 Claims, 2 Drawing Sheets

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2004-0111030 filed in the Korean Intellectual Property Office on Dec. 23, 2004, the entire contents of which are incorporated herein by reference.

BACKGROUND OF THE INVENTION (a) Field of the Invention

The present invention relates to a semiconductor device and a method of manufacturing the same.

(b) Description of the Related Art

Recently, as the design rule of semiconductor devices has been reduced, the width of a gate electrode has also decreased. In addition, in order to reduce the resistance of the gate electrode, the thickness of the gate electrode has increased.

A pocket region may be formed under the gate electrode for preventing a punch-through phenomenon due to the width reduction of the gate electrode. In order to form a pocket region under the gate electrode, a pocket ion implantation process is performed by tilting the direction of an ion beam. However, the space between the gate electrodes is narrow, so the pocket ion implantation in the opposite direction of the tilting direction may not be satisfactorily performed. That is called a shadow effect.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a semiconductor device and a method of manufacturing the same having advantages of enhancing yield and reliability of the product by suppressing a punch-through phenomenon.

An exemplary method of manufacturing a semiconductor device according to an embodiment of the present invention includes forming a gate insulation layer on a semiconductor substrate; forming a plurality of gate electrodes on the gate insulation layer; forming pocket regions by a pocket ion implantation process using the gate electrode as an implantation mask; forming a capping electrode layer on the gate electrode by depositing a polysilicon layer; forming lightly doped regions by low-concentration ion implantation using the capping electrode layer as an implantation mask; forming spacer layers on the sidewall of the capping electrode layer; and forming source and drain regions by high concentration ion implantation using the spacer layers as an implantation mask. The capping electrode layer may increase the width of the gate electrode to a predetermined width.

In a further embodiment, the capping electrode layer may be formed by depositing a polysilicon layer having a thickness of 5-20 nm.

In addition, the pocket ion implantation may be performed in a direction vertical to the semiconductor substrate.

An exemplary semiconductor device according to another embodiment of the present invention includes a semiconductor substrate provided with source and drain regions, lightly doped regions, and pocket regions; a gate insulation layer formed on the semiconductor substrate; a plurality of gate electrodes formed on the gate insulation layer; a capping electrode layer formed on the upper surface and the sidewall of the gate electrode; and a spacer layer formed on the sidewall of the capping electrode layer, wherein the pocket regions are formed under the sidewall of the capping electrode layer.

In addition, the width of the pocket region may be the same as the thickness of the capping electrode layer. The thickness of the capping electrode layer may be 5-20 nm.

In addition, the lightly doped regions may be formed under the spacer layer.

The semiconductor device and the method of manufacturing the same according to the present invention may not suffer from the shadow effect because of the pocket ion implantation performed in a vertical direction without tilting.

In addition, the low concentration ion implantation is performed so as to form the pocket region under the capping electrode, so the channel length under the gate electrode can be increased. Therefore, the occurrence of the punch-through phenomenon can be suppressed.

DETAILED DESCRIPTION OF THE EMBODIMENTS

Figure 1:
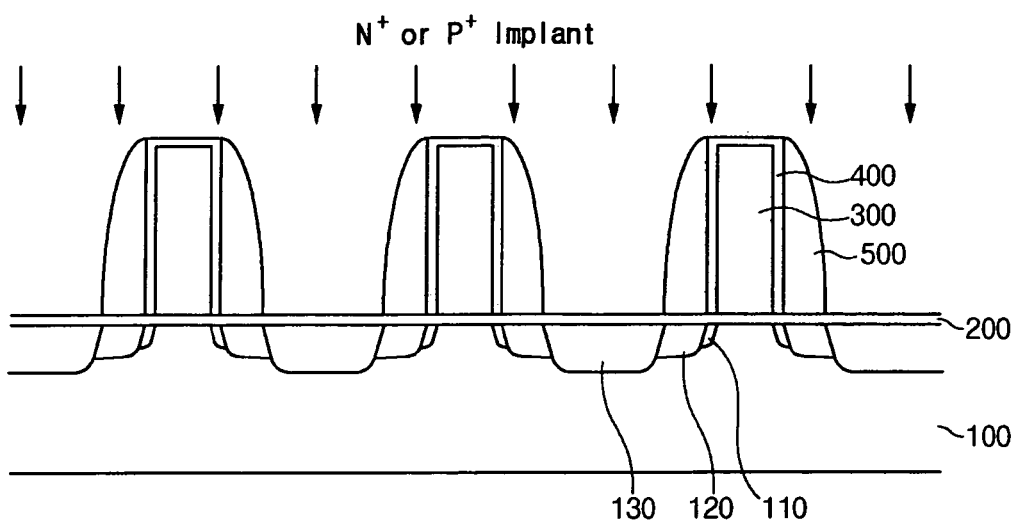
FIG. 1 is a cross-sectional view showing a semiconductor device according to an exemplary embodiment of the present invention.

An exemplary embodiment of the present invention will hereinafter be described in detail with reference to the accompanying drawings. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

Now, an exemplary semiconductor device and method of manufacturing the same according to an embodiment of the present invention will be described in detail with reference to the accompanying drawings.

FIG. 1 is a cross-sectional view showing a semiconductor device according to an exemplary embodiment of the present invention.

As shown in FIG. 1, in a semiconductor device according to an exemplary embodiment of the present invention, source, and drain regions 130, lightly doped regions 120, and pocket regions 110 are formed on a semiconductor substrate 100.

A gate insulation layer 200 is formed on the semiconductor substrate 100, and a plurality of gate electrodes 300 are formed thereon.

A capping electrode layer 400 is formed on the upper surface and the sidewall of the gate electrode 300, and spacer layers 500 are formed on the sidewall of the capping electrode layer 400.

The pocket regions 110 are formed under the sidewalls of the capping electrode layer 400. In addition, the width of the pocket region 110 may be the same as the thickness of the capping electrode layer 400. The thickness of the capping electrode layer 400 may be 5-20 nm. In addition, the lightly doped regions 120 may be formed under the spacer layer 500.

Figure 2:
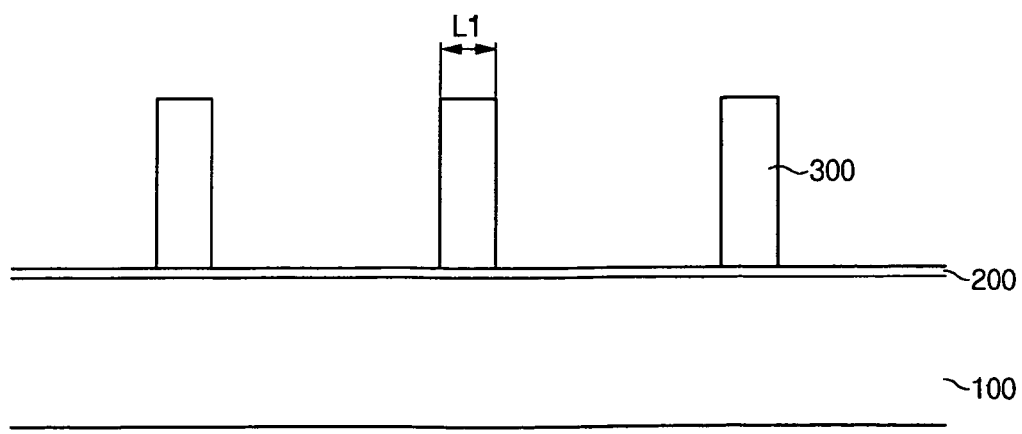
FIG. 2 to FIG. 4 are cross-sectional views showing principal stages of a semiconductor device according to an exemplary embodiment of the present invention.
Figure 3:
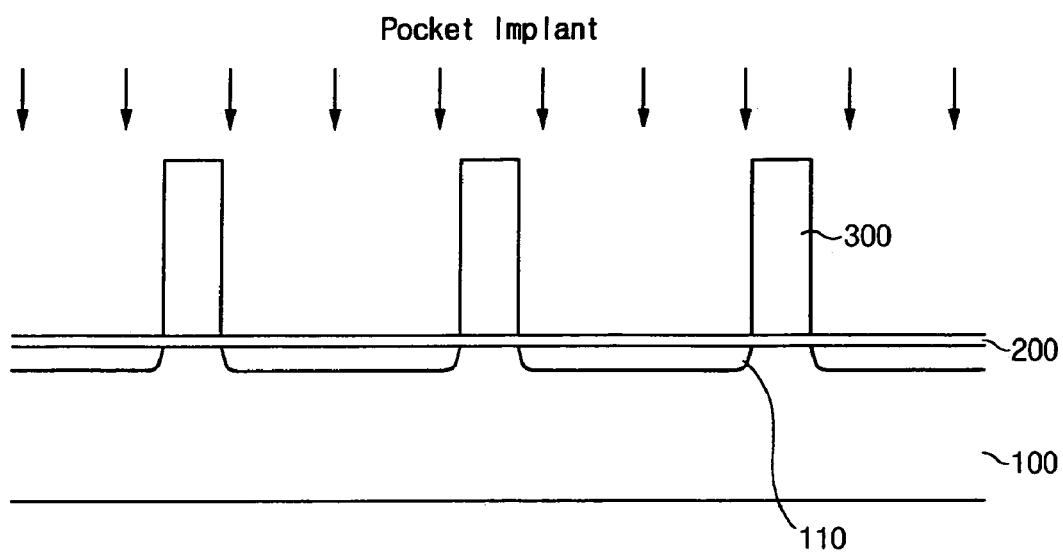
Figure 4:
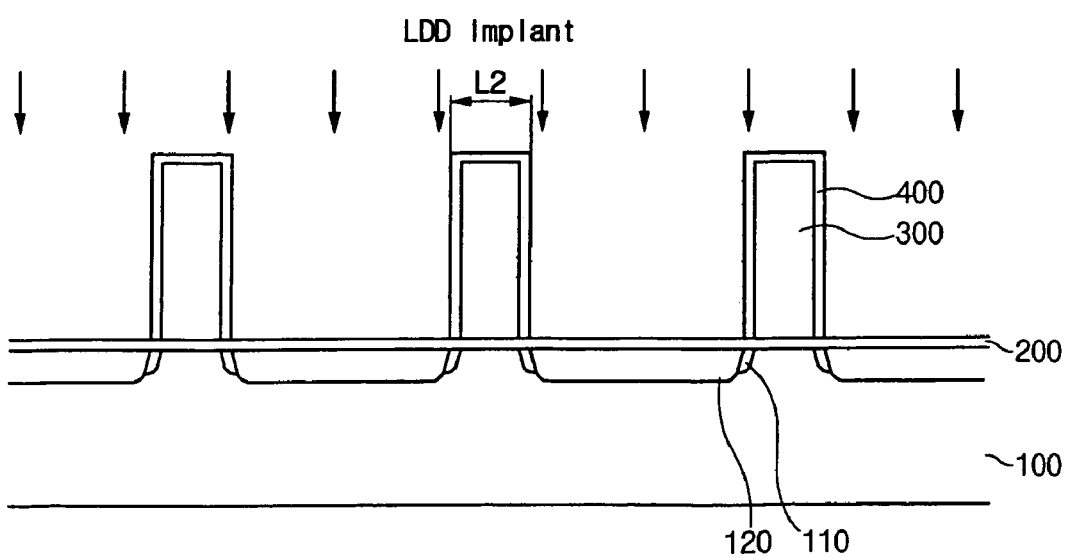

FIG. 2 to FIG. 4 are cross-sectional views showing principal stages of a semiconductor device according to an exemplary embodiment of the present invention.

As shown in FIG. 2, isolation layers and wells (not shown) are formed on a semiconductor (i.e., silicon) substrate 100, and an ion implantation process for adjusting a threshold voltage thereof may be performed. A gate insulation layer 200 such as a silicon oxide layer is formed on the semiconductor substrate 100.

In addition, a polysilicon layer is formed on the gate insulation layer 200 and is patterned to a plurality of gate electrodes 300 having a predetermined width L1 by a photolithography and etching process. The predetermined width may be smaller than the final width L2 by about 10 nm.

Subsequently, as shown in FIG. 3, pocket regions 110 are formed by a pocket ion implantation process using the gate electrode 300 as an implantation mask.

The pocket ion implantation may be performed in a direction vertical to the semiconductor substrate 100. In addition, the ions implanted in the pocket ion implantation may be of an opposite type to the ions used in the ion implantation process for adjusting the threshold voltage. That is, if the ions used in the ion implantation process are N-type ions, the ions implanted in the pocket ion implantation may be P-type, and visa versa.

In the pocket ion implantation, the implanted ions have the opposite type to the ions that will be implanted into the source/drain region, and the gate electrode 300 is used as an implantation mask. The pocket ion implantation can form a doping profile whose peak is formed at a deep region under the edge portion of the source/drain region. Such a highly doped region under the edge portion of the source/drain region causes a rise of the threshold voltage in accordance with a reduction of the effective length of the gate electrode 300, so a short channel effect can be suppressed. In addition, because the peak of the doping profile is located in a deep position, deterioration of carriers in the channel can be more effectively suppressed than in a substrate having a uniform doping profile.

Subsequently, as shown in FIG. 4, a polysilicon layer having a thickness of 5-20 nm, preferably 10 nm, is formed on the gate electrode 300 and etched so as to form a capping electrode layer 400 on the upper surface and the sidewall of the gate electrode 300. That is, the polysilicon layer formed on the semiconductor substrate 100 between the gate electrodes 300 is removed. The capping electrode layer 400 enables the width L2 of the gate electrode 300 to increase from width L1 and reach the final width. At this time, if the increased width are too large, the driving current of the transistor may be decreased, so it is required to be formed to an adequate thickness of 5-20 nm.

In addition, lightly doped regions 120 are formed by low-concentration ion implantation using the capping electrode layer 400 as an implantation mask.

Subsequently, as shown in FIG. 1, an insulation layer is formed on the semiconductor substrate 100 including the capping electrode layer 400 and is etched to form spacer layers 500 on the sidewall of the capping electrode layer 400.

In addition, source and drain regions 130 are formed by high concentration ion (i.e., N+ or P+ ion) implantation using the spacer layers 500 as an implantation mask.

In the pocket ion implantation for forming the pocket regions 110, the ions are implanted into the substrate in a vertical direction without tilting, so the shadow effect may be prevented.

In addition, the low concentration ion implantation is performed so as to form the pocket region 110 under the capping electrode layer 400, so the channel length under the gate electrode 300 can be increased. Therefore, the occurrence of the punch-through phenomenon can be suppressed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device, comprising:

forming a gate insulation layer on a semiconductor substrate;

forming a plurality of gate electrodes on the gate insulation layer;

forming pocket regions by a pocket ion implantation process using the plurality of gate electrodes as an implantation mask;

forming a capping electrode layer on the upper surface and the sidewall of the plurality of gate electrodes by depositing a polysilicon layer on the semiconductor substrate formed on the plurality of gate electrodes and removing the polysilicon layer formed between the plurality of gate electrodes;

forming lightly doped regions by low-concentration ion implantation using the capping electrode layer as an implantation mask;

forming spacer layers on the sidewall of the capping electrode layer; and forming source and drain regions by high-concentration ion implantation using the spacer layers as an implantation mask.

2. The method of claim 1, wherein the pocket ion implantation is performed in a direction vertical to the semiconductor substrate.

3. The method of claim 1, wherein the capping electrode layer increases the width of each of the plurality of gate electrodes to a predetermined width.

4. The method of claim 3, wherein the capping electrode layer is formed by depositing a polysilicon layer having a thickness of 5-20 nm.

* * * * *